US010187073B2

(12) United States Patent
Hashi

(10) Patent No.: US 10,187,073 B2
(45) Date of Patent: Jan. 22, 2019

(54) ELECTRONIC DEVICE, QUANTUM INTERFERENCE DEVICE, ATOMIC OSCILLATOR, MAGNETOCARDIOGRAPH, OSCILLATOR, ELECTRONIC APPARATUS, MOVING OBJECT, AND METHOD OF MANUFACTURING ELECTRONIC DEVICE

(71) Applicant: Seiko Epson Corporation, Tokyo (JP)

(72) Inventor: Yukihiro Hashi, Shiojiri (JP)

(73) Assignee: Seiko Epson Corporation (JP)

( * ) Notice: Subject to any disclaimer, the term of this patent is extended or adjusted under 35 U.S.C. 154(b) by 219 days.

(21) Appl. No.: 15/160,223

(22) Filed: May 20, 2016

(65) Prior Publication Data

US 2016/0352345 A1    Dec. 1, 2016

(30) Foreign Application Priority Data

May 28, 2015   (JP) ................................ 2015-108932

(51) Int. Cl.
*H03L 7/26*   (2006.01)
*H03B 5/32*   (2006.01)
*H03B 17/00*  (2006.01)
*G04F 5/14*   (2006.01)
*H03L 1/04*   (2006.01)

(52) U.S. Cl.
CPC ................. *H03L 7/26* (2013.01); *G04F 5/14* (2013.01); *H03B 5/32* (2013.01); *H03B 17/00* (2013.01); *H03L 1/04* (2013.01)

(58) Field of Classification Search
CPC .......... A61B 5/024; H03B 5/32; H03B 17/00; F17C 3/00; H03L 7/26; G04F 5/14; G04F 5/145
USPC ................................. 331/3, 94.1, 176; 206/7
See application file for complete search history.

(56) References Cited

U.S. PATENT DOCUMENTS

| 8,624,682 B2 | 1/2014 | Ridley et al. | |
|---|---|---|---|
| 9,164,491 B2 | 10/2015 | Ridley et al. | |
| 2011/0156190 A1 | 6/2011 | Mori | |
| 2011/0187466 A1* | 8/2011 | Youngner | G04F 5/145 331/94.1 |
| 2015/0027908 A1* | 1/2015 | Parsa | F17C 3/00 206/0.7 |

FOREIGN PATENT DOCUMENTS

| JP | 2010-251702 A | 11/2010 |
|---|---|---|
| JP | 2013-003139 A | 1/2013 |
| JP | 2013-254916 A | 12/2013 |

* cited by examiner

*Primary Examiner* — Arnold Kinkead
(74) *Attorney, Agent, or Firm* — Harness, Dickey & Pierce, P.L.C.

(57) ABSTRACT

An atomic oscillator includes a base, an atomic cell unit that is disposed on the base, a lid that constitutes an internal space accommodating the atomic cell unit together with the base, and a getter material that is disposed on the base with a gap with respect to the base in the internal space.

17 Claims, 13 Drawing Sheets

ELECTRONIC DEVICE, QUANTUM INTERFERENCE DEVICE, ATOMIC OSCILLATOR, MAGNETOCARDIOGRAPH, OSCILLATOR, ELECTRONIC APPARATUS, MOVING OBJECT, AND METHOD OF MANUFACTURING ELECTRONIC DEVICE

CROSS REFERENCE

This application claims the benefit of Japanese Application No. 2015-108932, filed on May 28, 2015. The disclosure of the prior application is hereby incorporated by reference herein in its entirety.

BACKGROUND

1. Technical Field

The present invention relates to an electronic device, a quantum interference device, an atomic oscillator, a magnetocardiograph, oscillator, an electronic apparatus, a moving object, and a method of manufacturing an electronic device.

2. Related Art

There have been known electronic devices that accommodate functional components in a package which is airtightly sealed (for example, see JP-A-2013-003139).

For example, a vapor cell atomic clock physical package disclosed in JP-A-2013-003139 includes a ceramic body and a ceramic lid bonded to the ceramic body, and the ceramic body and the ceramic lid define a cavity that accommodates a laser, a wavelength plate, a vapor cell, a heater, a photodetector, and the like. In general, in the package, the cavity is vacuum-sealed to achieve an improvement in characteristics such as power saving of a heater.

However, in the package disclosed in JP-A-2013-003139, the degree of vacuum of the cavity is lowered due to unnecessary gas released over time from a component disposed in the cavity, or the like during sealing or after sealing, which results in a problem that it is not possible to sufficiently achieve an improvement in characteristics.

SUMMARY

An advantage of some aspects of the invention is to provide an electronic device and a method of manufacturing the same which are capable of exhibiting excellent characteristics over a long period of time and to provide a quantum interference device, an atomic oscillator, a magnetocardiograph, an oscillator, an electronic apparatus, and a moving object which include the electronic device.

The invention can be implemented as the following forms or application examples.

Application Example 1

An electronic device according to this application example includes a base portion; a functional component that is disposed on the base portion; a lid portion that constitutes an internal space accommodating the functional component, together with the base portion; and a getter material that has a gap with respect to the base portion in the internal space and is disposed on the base portion.

According to the electronic device, it is possible to reduce unnecessary gas by adsorbing and removing the unnecessary gas in the internal space accommodating the functional component by the getter material. In particular, since the getter material is disposed so as to have a gap with respect to the base portion, it is possible to reduce the adverse influence (for example, damages of a sealing portion and a functional component) of heat on other portions when the getter material is activated by heating. For this reason, it is possible to maintain a high degree of vacuum of the internal space over a long period of time and to make the electronic device have excellent characteristics.

Meanwhile, in this specification, the wording "disposed on a base portion" includes not only a case of being directly mounted on the surface of the base portion but also a case of being mounted on the surface of the base portion through another member.

Application Example 2

It is preferable that the electronic device according to the application example of the invention further includes a heat generating portion that is disposed on the base portion with a gap with respect to the base portion in the internal space and is capable of heating the getter material.

With this configuration, it is possible to heat the getter material using the heat generating portion. In addition, since the heat generating portion is disposed so as to have a gap with respect to the base portion, it is possible to reduce the adverse influence (for example, damages of a sealing portion and a functional component) of heat of the heat generating portion on other portions.

Application Example 3

In the electronic device according to the application example of the invention, it is preferable that the getter material and the heat generating portion are laminated on each other.

With this configuration, it is possible to realize the getter material and the heat generating portion which are small in size and are capable of easily being formed on the base portion.

Application Example 4

In the electronic device according to the application example of the invention, it is preferable that the number of layers of the getter material is two and the heat generating portion is present between the two layers of the getter material.

With this configuration, it is possible to increase the surface area of the getter material while reducing an installation space of a structure including the getter material and the heat generating portion.

Application Example 5

It is preferable that the electronic device according to the application example of the invention further includes a conductive terminal that connects the heat generating portion and the base portion to each other.

With this configuration, it is possible to make the heat generating portion generate heat by supplying power to the heat generating portion through the conductive terminal.

Application Example 6

In the electronic device according to the application example of the invention, it is preferable that the conductive terminal includes copper.

Copper has excellent conductivity and is a relatively soft metal among metals. For this reason, it is possible to efficiently supply power to the heat generating portion through the conductive terminal by constituting the conductive terminal using copper and to relax stress between the heat generating portion and the base portion by the conductive terminal even when the heat generating portion thermally expands in association with heat generation.

Application Example 7

In the electronic device according to the application example of the invention, it is preferable that the base portion or the lid portion includes a hole passing through an inside and an outside of the internal space, and that the hole is closed by a sealing material.

With this configuration, before the activation of the getter material, it is possible to reduce unnecessary gas in the internal space by increasing the degree of vacuum of the internal space. For this reason, it is possible to reduce the volume of the getter material, and accordingly, to achieve a reduction in the size of the electronic device.

Application Example 8

It is preferable that the electronic device according to the application example of the invention further includes a temperature adjusting unit that adjusts temperature of the functional component.

With this configuration, it is possible to keep the functional component at a desired temperature and to make the electronic device have excellent characteristics.

Application Example 9

A quantum interference device according to this application example includes the electronic device of the invention.

According to the quantum interference device, it is possible to maintain a high degree of vacuum of an internal space over a long period of time and to make the atomic oscillator have excellent characteristics.

Application Example 10

In the quantum interference device according to the application example of the invention, it is preferable that the functional component includes an atomic cell that accommodates metal atoms, a light source unit that emits resonating light to the metal atoms, and an atomic cell unit that includes a light receiving unit detecting the light having passed through the atomic cell.

With this configuration, it is possible to control the temperature of the atomic cell, the light source unit, and the like with a high level of accuracy and to make the quantum interference device have excellent characteristics.

Application Example 11

In the quantum interference device according to the application example of the invention, it is preferable that a supporting portion which is disposed between the atomic cell unit and the base portion.

With this configuration, it is possible to reduce heat transfer between the atomic cell unit and the outside and to control the temperature of the atomic cell, the light source unit, and the like with a high level of accuracy. In addition, when the getter material is activated by heating, it is possible to reduce heat transfer between the atomic cell unit and the getter material and to reduce the adverse influence of the heat on the atomic cell unit.

Application Example 12

It is preferable that the quantum interference device according to the application example of the invention further includes a heat generating portion that is disposed on the base portion with a gap with respect to the base portion in the internal space and is capable of heating the getter material, and that a distance between the base portion and the heat generating portion is smaller than a distance between the base portion and the atomic cell.

With this configuration, it is possible to reduce heat transfer from the heat generating portion to the atomic cell unit.

Application Example 13

An atomic oscillator according to this application example includes the quantum interference device according to the application example of the invention.

According to the atomic oscillator, it is possible to maintain a high degree of vacuum of an internal space over a long period of time and to make the atomic oscillator have excellent characteristics.

Application Example 14

A magnetocardiograph according to this application example includes the quantum interference device according to the application example of the invention.

According to the magnetocardiograph, it is possible to maintain a high degree of vacuum of an internal space over a long period of time and to make the atomic oscillator have excellent characteristics.

Application Example 15

An oscillator according to this application example includes the electronic device according to the application example of the invention, and the functional component is a vibrator.

According to the crystal oscillator, it is possible to maintain a high degree of vacuum of an internal space over a long period of time and to make the atomic oscillator have excellent characteristics.

Application Example 16

An electronic apparatus according to this application example includes the electronic device according to the application example of the invention.

According to the electronic apparatus, since the electronic device has excellent characteristics over a long period of time, it is possible to exhibit excellent reliability.

Application Example 17

A moving object according to this application example includes the electronic device according to the application example of the invention.

According to the moving object, since the electronic device has excellent characteristics over a long period of time, it is possible to exhibit excellent reliability.

Application Example 18

A method of manufacturing an electronic device according to this application example includes forming an internal space by a base portion and a lid portion, the internal space having a hole, passing through any one of the base portion and the lid portion, formed therein and accommodating a functional component and a getter material in a state where the functional component and the getter material are disposed on the base portion; sealing the internal space by closing the hole by a sealing material; and activating the getter material by heating in a state where the getter material is disposed so as to have a gap with respect to the base portion.

According to the method of manufacturing an electronic device, it is possible to reduce unnecessary gas by adsorbing and removing the unnecessary gas in the internal space accommodating the functional component by the getter material. In particular, since the getter material is disposed so as to have a gap with respect to the base portion, it is possible to reduce the adverse influence (for example, damages of a sealing portion and a functional component) of heat on other portions when the getter material is activated by heating. For this reason, it is possible to maintain a high degree of vacuum of the internal space over a long period of time and to make the electronic device have excellent characteristics.

BRIEF DESCRIPTION OF THE DRAWINGS

The invention will be described with reference to the accompanying drawings, wherein like numbers reference like elements.

FIG. 6A is a plan view, and FIG. 6B is a cross-sectional view taken along line A-A in FIG. 6A.

FIG. 9A is a plan view, and FIG. 9B is a cross-sectional view taken along line A-A in FIG. 9A.

DESCRIPTION OF EXEMPLARY EMBODIMENTS

Hereinafter, an electronic device, a quantum interference device, an atomic oscillator, a magnetocardiograph, an oscillator, an electronic apparatus, a moving object, and a method of manufacturing an electronic device according to embodiments of the invention will be described in detail on the basis of embodiments illustrated in the accompanying drawings.

1. Electronic Device

First Embodiment (Atomic Oscillator)

First, an electronic device according to a first embodiment of the invention will be described. In this embodiment, a description will be given of an example in which the electronic device according to the invention is applied to an atomic oscillator (quantum interference device) using a quantum interference effect.

Figure 1:
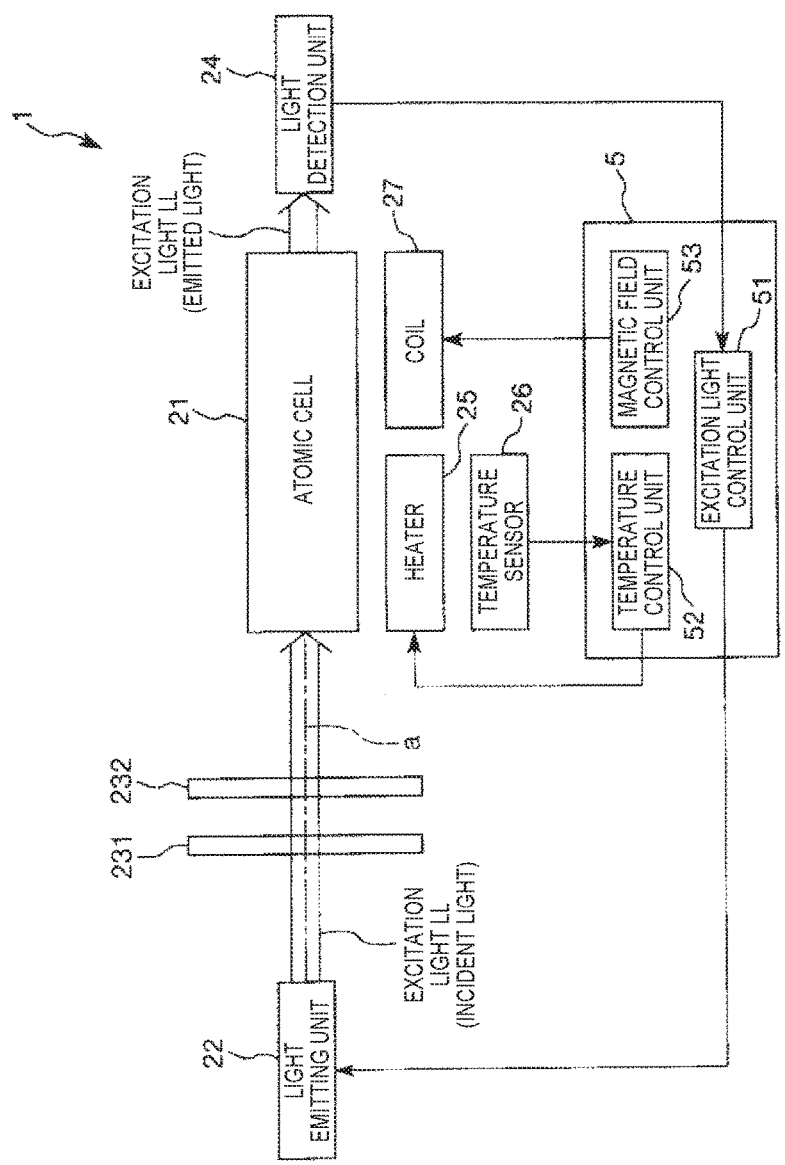
FIG. 1 is a schematic diagram illustrating an electronic device (atomic oscillator) according to a first embodiment of the invention.
Figure 2:
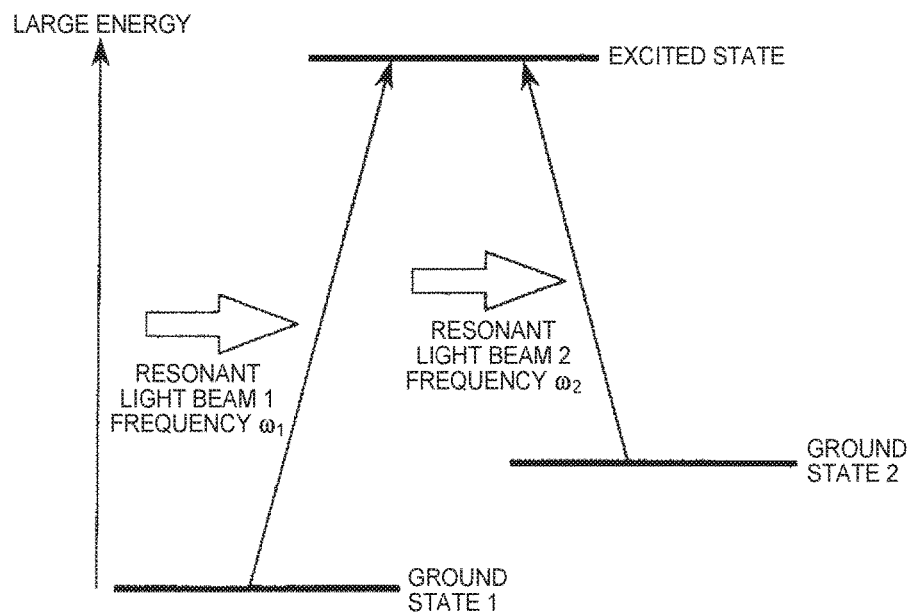
FIG. 2 is a diagram illustrating an energy state of an alkali metal.
Figure 3:
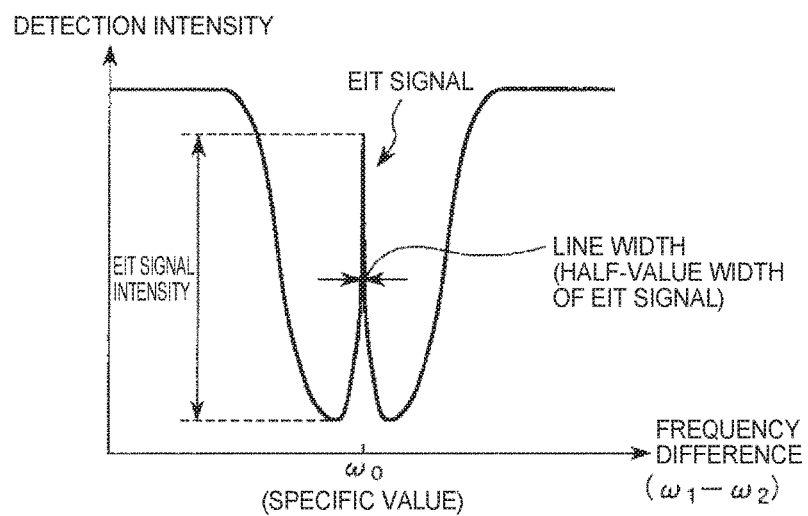
FIG. 3 is a graph illustrating a relationship between a difference in frequency between two light beams from a light emitting unit and detection intensity in a light detection unit.

FIG. 1 is a schematic diagram illustrating an electronic device (atomic oscillator) according to the first embodiment of the invention. FIG. 2 is a diagram illustrating an energy state of an alkali metal, and FIG. 3 is a graph illustrating a relationship between a difference in frequency between two light beams from a light emitting unit and detection intensity in a light detection unit.

An atomic oscillator 1 illustrated in FIG. 1 is an atomic oscillator using a quantum interference effect.

As illustrated in FIG. 1, the atomic oscillator 1 includes an atomic cell 21, a light emitting unit 22, optical components 231 and 232, a light detection unit 24, a heater 25 (heating unit), a temperature sensor 26, a coil 27, and a control unit 5 that controls units of the atomic oscillator 1.

First, a principle of the atomic oscillator 1 will be briefly described.

As illustrated in FIG. 1, in the atomic oscillator 1, the light emitting unit 22 emits excitation light LL toward the atomic cell 21, and the light detection unit 24 detects the excitation light LL having passed through the atomic cell 21.

A gaseous alkali metal (metal atom) is sealed in the atomic cell 21, and the alkali metal has an energy level of a three-level system as illustrated in FIG. 2 and may take three states of two ground states (ground states 1 and 2) having different energy levels and an excited state. Here, the ground state 1 is an energy state lower than the ground state 2.

The excitation light LL emitted from the light emitting unit 22 includes two types of resonant light beams 1 and 2 having different frequencies. When the above-mentioned gaseous alkali metal is irradiated with the two types of resonant light beams 1 and 2, light absorptance (light transmittance) of the resonant light beams 1 and 2 in the alkali metal varies depending on a difference ($\omega_1 - \omega_2$) between a frequency $\omega_1$ of the resonant light 1 and a frequency $\omega_2$ of the resonant light 2.

When the difference ($\omega_1 - \omega_2$) between the frequency $\omega_1$ of the resonant light 1 and the frequency $\omega_2$ of the resonant light 2 is consistent with a frequency equivalent to an energy difference between the ground state 1 and the ground state 2, excitation from each of the ground states 1 and 2 to the excited state is stopped. At this time, both the resonant light beams 1 and 2 are transmitted without being absorbed into the alkali metal. Such a phenomenon is called a CPT phenomenon or an electromagnetically induced transparency (EIT) phenomenon.

For example, when the light emitting unit 22 fixes the frequency $\omega_1$ of the resonant light 1 and gradually changes the frequency $\omega_2$ of the resonant light 2, the detection intensity of the light detection unit 24 increases sharply in association with the above-mentioned EIT phenomenon as illustrated in FIG. 3 when the difference ($\omega_1-\omega_2$) between the frequency $\omega_1$ of the resonant light 1 and the frequency $\omega_2$ of the resonant light 2 is consistent with a frequency $\omega_0$ equivalent to the energy difference between the ground state 1 and the ground state 2. Such a sharp signal is detected as an EIT signal. The EIT signal has a fixed value determined based on the type of alkali metal. Therefore, it is possible to configure an oscillator by using such an EIT signal.

Hereinafter, a configuration of each unit of the atomic oscillator 1 according to this embodiment will be described.

Figure 4:
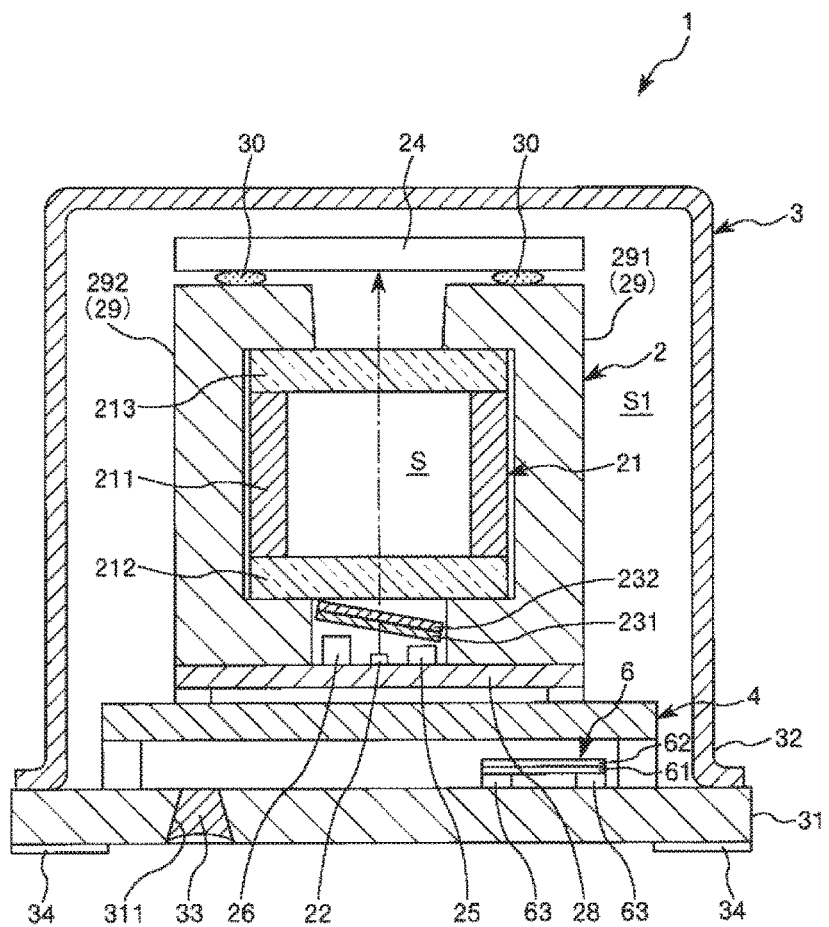
FIG. 4 is a cross-sectional view illustrating a schematic configuration of the electronic device illustrated in FIG. 1.
Figure 5:
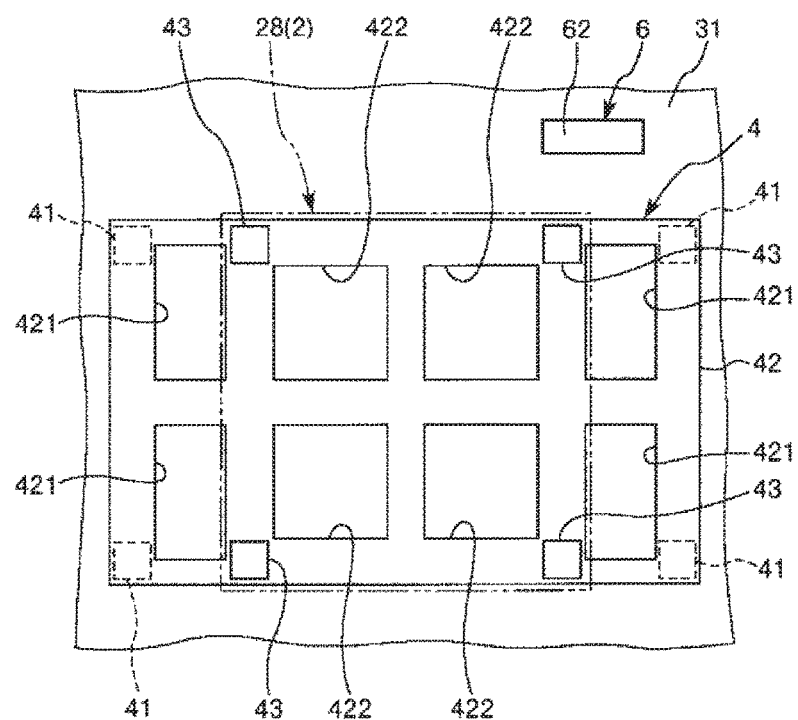
FIG. 5 is a plan view illustrating the arrangement of functional components and a getter material illustrated in FIG. 4.
Figure 6A:
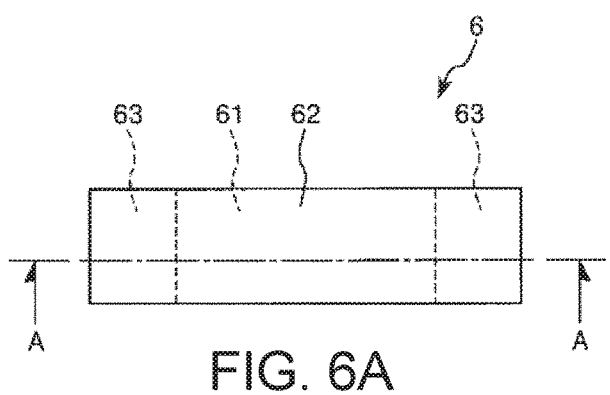
FIGS. 6A and 6B are diagrams illustrating the getter material, a heat generating portion, and a conductive terminal illustrated in FIG. 5.
Figure 6B:
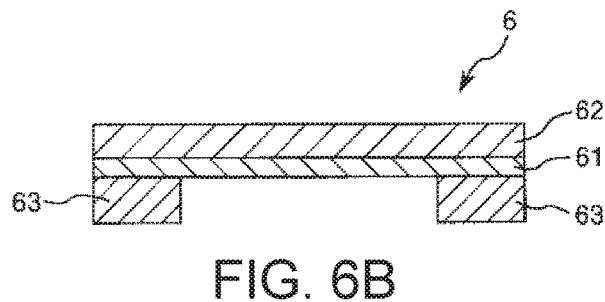

FIG. 4 is a cross-sectional view illustrating a schematic configuration of the electronic device illustrated in FIG. 1. FIG. 5 is a plan view illustrating the arrangement of functional components and a getter material illustrated in FIG. 4. FIGS. 6A and 6B are diagrams illustrating the getter material, a heat generating portion, and a conductive terminal illustrated in FIG. 5, FIG. 6A is a plan view, and FIG. 6B is a cross-sectional view taken along line A-A in FIG. 6A. Meanwhile, hereinafter, for convenience of description, an upper side and a lower side in FIG. 4 are referred to as "upper" and "lower", respectively.

As illustrated in FIG. 4, the atomic oscillator 1 (electronic device) includes an atomic cell unit 2 (functional component) that generates the above-mentioned quantum interference effect, a package 3 that accommodates the atomic cell unit 2, a supporting member 4 (supporting portion) which is accommodated in the package 3 and supports the atomic cell unit 2 with respect to the package 3, and a getter member 6 which is accommodated in the package 3. Meanwhile, although not shown in the drawing, the coil 27 is disposed inside or outside the package 3 so as to surround the atomic cell unit 2. In addition, a magnetic shield is provided on the outer side of the package 3, as necessary.

In addition, the atomic cell unit 2 includes the atomic cell 21, the light emitting unit 22 (light source unit), the optical components 231 and 232, the light detection unit 24 (light receiving unit), the heater 25 (temperature adjusting unit), the temperature sensor 26, a substrate 28, and a connection member 29, which are unitized. Specifically, the light emitting unit 22, the heater 25, the temperature sensor 26, and the connection member 29 are mounted on the upper surface of the substrate 28, the atomic cell 21 and the optical components 231 and 232 are held by the connection member 29, and the light detection unit 24 is bonded to the connection member 29 through an adhesive 30.

Hereinafter, units of the atomic oscillator 1 will be described.

Atomic Cell

An alkali metal such as gaseous rubidium, cesium, or sodium is sealed within the atomic cell 21. In addition, rare gas such as argon or neon and inert gas such as nitrogen may be sealed within the atomic cell 21 as buffer gas together with alkali metal gas, as necessary.

As illustrated in FIG. 4, the atomic cell 21 includes a body portion 211 having a columnar through hole, and a pair of light transmitting portions 212 and 213 that block openings on both sides of the through hole. Thereby, an internal space S having the above-mentioned alkali metal sealed therein is formed.

Here, the light transmitting portions 212 and 213 of the atomic cell 21 has permeability with respect to the excitation light LL (resonant light) from the light emitting unit 22. In addition, the light transmitting portion 212 is a "light transmitting portion on incidence side" through which excitation light incident on the atomic cell 21 passes, and the light transmitting portion 213 is a "light transmitting portion on emission side" through which excitation light emitted from the atomic cell 21 passes.

A material constituting the light transmitting portions 212 and 213 is not particularly limited insofar as the material has permeability with respect to the above-mentioned excitation light, and includes, for example, a glass material, crystal, and the like.

In addition, a material constituting the body portion 211 of the atomic cell 21 is not particularly limited. However, the material may be a silicon material, a ceramic material, a metal material, a resin material, or the like and may be a glass material, crystal, or the like similar to the light transmitting portions 212 and 213.

The light transmitting portions 212 and 213 are airtightly bonded to the body portion 211. Thereby, the internal space S of the atomic cell 21 can be configured as an airtight space.

A method of bonding the body portion 211 and the light transmitting portions 212 and 213 of the atomic cell 21 is determined based on the constituent materials thereof, and is not particularly limited. However, for example, a bonding method using an adhesive, a direct bonding method, an anodic bonding method, or the like can be used.

Light Emitting Unit

The light emitting unit 22 has a function of emitting excitation light LL exciting alkali metal atoms in the atomic cell 21.

More specifically, the light emitting unit 22 emits the above-mentioned two types of light beams (resonant light 1 and resonant light 2) having different frequencies as excitation light. The frequency $\omega_1$ of the resonant light 1 is capable of exciting (resonating) an alkali metal in the atomic cell 21 from the ground state 1 mentioned above to an excited state. In addition, the frequency $\omega_2$ of the resonant light 2 is capable of exciting (resonating) an alkali metal in the atomic cell 21 from the ground state 2 to an excited state.

The light emitting unit 22 is not particularly limited insofar as the light emitting unit can emit the above-mentioned excitation light. For example, a semiconductor laser such as a vertical cavity surface emitting laser (VCSEL) can be used.

Optical Component

As illustrated in FIG. 4, the plurality of optical components 231 and 232 are provided on a light path of excitation light between the above-mentioned light emitting unit 22 and atomic cell 21. In this embodiment, the optical component 231 and the optical component 232 are disposed in this order from the light emitting unit 22 side to the atomic cell 21 side.

The optical component 231 is a λ/4 wavelength plate. Thereby, excitation light LL from the light emitting unit 22 can be converted from linearly polarized light to circularly polarized light (right circularly polarized light or left circularly polarized light).

When alkali metal atoms in the atomic cell 21 are irradiated with excitation light which is linearly polarized light in a state where Zeeman splitting of the alkali metal atoms is performed by a magnetic field of the coil 27, the alkali metal atoms are present in a state of being equally dispersed to a plurality of levels at which the Zeeman splitting is performed, by an interaction between the excitation light and the alkali metal atoms. As a result, the number of alkali metal atoms having a desired energy level becomes relatively smaller than the number of alkali metal atoms having the other energy levels, and thus the number of atoms exhibiting a desired EIT phenomenon is reduced and the intensity of a desired EIT signal is lowered, which results in a deterioration of an oscillation characteristic of the atomic oscillator 1.

On the other hand, when alkali metal atoms in the atomic cell 21 are irradiated with excitation light which is circularly polarized light in a state where Zeeman splitting of the alkali metal atoms is performed by a magnetic field of the coil 27, the number of alkali metal atoms having a desired energy level, among a plurality of levels at which Zeeman splitting of the alkali metal atoms is performed, can be made relatively larger than the number of alkali metal atoms having the other energy levels by an interaction between the excitation light and the alkali metal atoms. For this reason, the number of atoms exhibiting a desired EIT phenomenon is increased, and the intensity of a desired EIT signal is increased. As a result, it is possible to improve an oscillation characteristic of the atomic oscillator 1.

Meanwhile, the coil 27 may be a solenoid coil or may be a Helmholtz coil. In addition, a magnetic field generated by the coil 27 may be either a DC magnetic field or an AC magnetic field, or may be a magnetic field in which a DC magnetic field and an AC magnetic field are superimposed on each other.

The optical component 232 is a dimming filter (ND filter). Thereby, it is possible to adjust (reduce) the intensity of excitation light LL incident on the atomic cell 21. For this reason, even when the output of the light emitting unit 22 is large, it is possible to set the amount of excitation light incident on the atomic cell 21 to a desired amount of light. In this embodiment, the intensity of excitation light LL, having polarized light in a predetermined direction, which has passed through the optical component 231 mentioned above is adjusted by the optical component 232.

Meanwhile, other optical components such as a lens and a polarizing plate, other than the wavelength plate and the dimming filter, may be disposed between the light emitting unit 22 and the atomic cell 21. In addition, the optical component 232 may be omitted depending on the intensity of excitation light from the light emitting unit 22.

Light Detection Unit

The light detection unit 24 has a function of detecting the intensity of excitation light LL (resonant light beams 1 and 2) which has passed through the atomic cell 21.

The light detection unit 24 is not particularly limited insofar as the light detection unit can detect the above-mentioned excitation light LL. For example, a photodetector (light receiving element) such as a solar cell or a photodiode can be used.

Heater

The heater 25 includes a heating resistor (heating unit) that generates heat by electrical conduction. The heater 25 is a "temperature adjusting unit (temperature adjusting element)" that adjusts the temperature of the atomic cell 21. Thereby, it is possible to keep the atomic cell unit 2 which is a functional component at a desired temperature and to make the atomic oscillator 1 have excellent characteristics.

In this embodiment, as described above, the heater 25 is provided on the substrate 28. Heat emitted from the heater 25 is transmitted to the atomic cell 21 through the substrate 28 and the connection member 29. Thereby, the atomic cell 21 (more specifically, an alkali metal in the atomic cell 21) is heated, and thus it is possible to keep the alkali metal in the atomic cell 21 in a state of gas having a desired concentration. In addition, in this embodiment, heat emitted from the heater 25 is also transmitted to the light emitting unit 22 through the substrate 28.

The heater 25 is separated from the atomic cell 21. Thereby, it is possible to prevent an unnecessary magnetic field generated due to electrical conduction to the heater 25 from exerting adverse influence on metal atoms within the atomic cell 21.

Temperature Sensor

The temperature sensor 26 detects the temperature of the heater 25 or the atomic cell 21. The amount of heat generated from the heater 25 is controlled on the basis of results of the detection of the temperature sensor 26. Thereby, it is possible to keep alkali metal atoms within the atomic cell 21 at a desired temperature.

In this embodiment, the temperature sensor 26 is provided on the substrate 28. Therefore, the temperature sensor 26 detects the temperature of the heater 25 through the substrate 28. Alternatively, the temperature sensor 26 detects the temperature of the atomic cell 21 through the substrate 28 and the connection member 29.

Meanwhile, the installation position of the temperature sensor 26 is not limited thereto. For example, the temperature sensor may be installed on the connection member 29, may be installed on the heater 25, or may be installed on the outer surface of the atomic cell 21.

The temperature sensor 26 is not particularly limited, and various known temperature sensors such as a thermistor and a thermocouple can be used.

Connection Member

The connection member 29 thermally connects the heater 25 and the light transmitting portions 212 and 213 of the atomic cell 21. Thereby, it is possible to heat from the heater 25 to the light transmitting portions 212 and 213 by thermal conduction of the connection member 29 and to heat the light transmitting portions 212 and 213. In addition, it is possible to separate the heater 25 and the atomic cell 21 from each other. For this reason, it is possible to prevent an unnecessary magnetic field generated due to electrical conduction to the heater 25 from exerting adverse influence on alkali metal atoms within the atomic cell 21. In addition, the number of heaters 25 can be reduced, and thus, for example, the number of wirings for electrical conduction to the heater 25 is reduced. As a result, it is possible to achieve a reduction in the size of the atomic oscillator 1 (quantum interference device).

As illustrated in FIG. 4, the connection member 29 is constituted by a pair of connection members 291 and 292 provided with the atomic cell 21 interposed therebetween. Thereby, it is possible to equally transmit heat to the light transmitting portions 212 and 213 of the atomic cell 21 from the connection member 29 while facilitating the installation of the connection member 29 with respect to the atomic cell 21.

For example, the pair of connection members 291 and 292 are fitted to each other so as to interpose the atomic cell 21 therebetween from both sides of a pair of side surfaces of the atomic cell 21 which face each other. The light transmitting portions 212 and 213 and the connection members 291 and 292 are in contact with each other and are thermally connected to each other. In addition, the connection members 291 and 292 are formed so as to avoid a passing region of excitation light LL.

Meanwhile, a gap may be formed between the connection members 291 and 292 and at least one of the light transmitting portion 212 and the light transmitting portion 213. In this case, it is preferable that the gap is filled with a thermally conductive adhesive. Thereby, it is possible to thermally connect the light transmitting portions 212 and 213 and the connection members 291 and 292 to each other. Examples of the adhesive include a resin-based adhesive, a silicone resin-based adhesive, and the like which contain metal paste and a heat-resistant filler.

In addition, each of the connection members 291 and 292 is disposed so as to form a gap between the connection member and the body portion 211 of the atomic cell 21. Thereby, it is possible to suppress the transmission of heat between each of the connection members 291 and 292 and the body portion 211 of the atomic cell 21 and to effectively transmit heat to the light transmitting portions 212 and 213 from the connection members 291 and 292.

A constituent material of the connection member 29 may be a material having a larger thermal conductivity than that of a material for forming the atomic cell 21, but it is preferable that a material having excellent thermal conductivity, for example, a metal material is used. Similarly to the package 3 to be described later, it is preferable to use a nonmagnetic material as a constituent material of the connection member 29 so as not to hinder a magnetic field from the coil 27.

Substrate

The substrate 28 has a function of supporting the above-mentioned light emitting unit 22, heater 25, temperature sensor 26, connection member 29, and the like. In addition, the substrate 28 has a function of transmitting heat emitted from the heater 25 to the connection member 29. Thereby, even when the heater 25 is separated from the connection member 29, it is possible to transmit heat emitted from the heater 25 to the connection member 29.

Here, the substrate 28 thermally connects the heater 25 and the connection member 29 to each other. In this manner, the heater 25 and the connection member 29 are mounted on the substrate 28, and thus it is possible to increase the degree of freedom of the installation of the heater 25.

In addition, the light emitting unit 22 is mounted on the substrate 28, and thus it is possible to adjust the temperature of the light emitting unit 22 on the substrate 28 by heat emitted from the heater 25.

In addition, the substrate 28 includes a wiring (not shown) which is electrically connected to the light emitting unit 22, the heater 25, and the temperature sensor 26.

A constituent material of the substrate 28 is not particularly limited, and examples of the constituent material include a ceramic material, a metal material, and the like. Among these, one type of material can be independently used, or two or more types of materials can be used in combination with each other. Meanwhile, in a case where the surface of the substrate 28 is formed of a metal material, it is also possible to increase the reflexibility of heat from the surface of the substrate 28 and to suppress the radiation of heat from the substrate 28. In addition, in a case where the substrate 28 is formed of a metal material, an insulating layer formed of, for example, a resin material, a metal oxide, or a metal nitride may be provided on the surface of the substrate 28 as necessary for the purpose of preventing a short-circuit of a wiring included in the substrate 28.

Similarly to the package 3 to be described later, it is preferable to use a nonmagnetic material as a constituent material of the substrate 28 so as not to hinder a magnetic field from the coil 27.

Meanwhile, the substrate 28 can be omitted depending on the shape of the connection member 29, the installation position of the heater 25, or the like. In this case, the heater 25 may be installed at a position coming into contact with the connection member 29.

Package

As illustrated in FIG. 4, the package 3 has a function of accommodating the atomic cell unit 2 and the supporting member 4. Meanwhile, components other than the above-mentioned components may be accommodated in the package 3.

As illustrated in FIG. 4, the package 3 includes a plate-shaped base 31 (base portion) and a bottomed cylindrical lid 32 (lid portion), and an opening of the lid 32 is blocked by the base 31. Thereby, an internal space S1 accommodating the atomic cell unit 2 and the supporting member 4 is formed. Here, the lid 32 is separated from the atomic cell unit 2 and the supporting member 4. That is, a space is provided between the lid 32, the atomic cell unit 2, and the supporting member 4. Thereby, the space functions as a heat insulating layer, and thus it is possible to reduce heat interference between the atomic cell unit 2 and the outside of the package 3.

The base 31 supports the atomic cell unit 2 through the supporting member 4.

In addition, the base 31 is, for example, a wiring substrate, and a plurality of terminals 34 are provided on a lower surface of the base 31. Although not shown in the drawing, the plurality of terminals 34 are electrically connected to a plurality of terminals including a conductive terminal 63 to be described later which is provided on an upper surface of the base 31 through a wiring passing through the base 31. The above-mentioned light emitting unit 22, substrate 28, and the like are electrically connected to the base 31 through a wiring (for example, a flexible wiring substrate, a bonding wire, or the like) which is not shown in the drawing.

In addition, a hole 311 (sealing hole) is formed in the base 31 so as to pass therethrough (pass the inside and outside of the internal space S1) in the thickness direction thereof. The hole 311 is airtightly closed by a sealing material 33 formed of a metal such as AuGe. Thereby, it is possible to reduce unnecessary gas in the internal space S1 by increasing the degree of vacuum of the internal space S1, as compared to a case where sealing is performed at the same time as bonding between the base 31 and the lid 32 before the activation of a getter member 6 of the getter material 62 which is to be described later. For this reason, it is possible to reduce the volume of the getter material 62, and accordingly, to achieve a reduction in the size of the atomic oscillator 1. Meanwhile, the sealing hole may be provided in the lid 32.

A constituent material of the base 31 is not particularly limited. For example, a resin material, a ceramic material, or the like can be used, but it is preferable to use a ceramic material. Thereby, it is possible to make the internal space S1 have excellent airtightness while realizing the base 31 constituting a wiring substrate.

The lid 32 is bonded to the base 31. A method of bonding the base 31 and the lid 32 is not particularly limited. For example, brazing, seam welding, energy ray welding (laser welding, electron ray welding, or the like), or the like can be used. Meanwhile, a bonding member for bonding the base 31 and the lid 32 to each other may be interposed therebetween.

In addition, it is preferable that the base 31 and the lid 32 are airtightly bonded to each other. That is, it is preferable that the inside of the package 3 is an airtight space. Thereby, the inside of the package 3 can be set to be in a reduced pressure state. As a result, it is possible to improve characteristics of the atomic oscillator 1.

In particular, it is preferable that the inside of the package 3 is set to be in a reduced pressure state (vacuum). Thereby, it is possible to suppress the transmission of heat through an internal space of the package 3. For this reason, it is possible to suppress heat interference between the connection member 29 and the outside of the package 3. In addition, it is possible to effectively suppress the transmission of heat between the atomic cell unit 2 and the outside of the package 3. In addition, it is possible to reduce the power consumption of the heater 25 in keeping the atomic cell 21 at a predetermined temperature using the heater 25 mentioned above.

A constituent material of the lid 32 is not particularly limited. For example, a resin material, a ceramic material, a metal material, or the like can be used, but it is preferable to use a metal material such as Kovar, a 42 alloy, stainless steel. Thereby, it is possible to make the internal space S1 have excellent airtightness while realizing the lid 32 having a magnetic shielding property. In addition, in a case where the coil 27 is disposed outside the package 3, a nonmagnetic material such as SUS304 can be used as the constituent material of the lid 32. Thereby, the volume of the internal space S1 can be reduced, it is possible to make the internal space S1 have excellent airtightness and to reduce the power consumption of the heater 25.

Supporting Member

The supporting member 4 (supporting portion) is accommodated in the package 3, and has a function of supporting the atomic cell unit 2 with respect to the package 3 (more specifically, the base 31 constituting a portion of the package 3).

In addition, the supporting member 4 has a function of suppressing the transmission of heat between the atomic cell unit 2 and the outside of the package 3. Thereby, it is possible to suppress heat interference between portions of the atomic cell unit 2 and the outside.

As illustrated in FIG. 5, the supporting member 4 includes a plurality of (four in this embodiment) leg portions 41 (column portion), a plurality of (four in this embodiment) column portions 43, and a connection portion 42 that connects the plurality of leg portions 41 and the plurality of column portions 43.

The plurality of leg portions 41 are disposed on the outer side of the atomic cell unit 2 when seen in a plan view.

Each of the leg portions 41 has a square columnar shape, and extends in a direction perpendicular to an internal surface of the base 31. Meanwhile, the leg portion 41 is not limited to the above-mentioned shape. For example, the leg portion may have, for example, a tubular shape, or the cross-section of the leg portion may have a circular shape.

A lower end portion of each of the leg portions 41 is bonded to the base 31 of the package 3 using, for example, an adhesive. On the other hand, the upper end portions (the other ends) of the plurality of leg portions 41 are connected to each other through the connection portion 42.

The connection portion 42 has a plate shape as a whole, and a plurality of through holes 421 and a plurality of through holes 422 are formed in the connection portion 42 so as to pass therethrough in the thickness direction thereof. Thereby, it is possible to suppress the transmission of heat in the connection portion 42 while securing the rigidity of the connection portion 42.

The plurality of through holes 421 are disposed so as to have a portion which is positioned between the leg portion 41 and the column portion 43 when seen in a plan view. Thereby, it is possible to increase thermal resistance between the leg portion 41 and the column portion 43 through the connection portion 42.

In addition, the plurality of through holes 422 are provided at a position overlapping the atomic cell unit 2 when seen in a plan view. Thereby, it is possible to further increase thermal resistance of the entire connection portion 42.

In this embodiment, the shape of each of the through holes 421 and 422 when seen in a plan view has a quadrilateral shape. Meanwhile, the shape when seen in a plan view is not limited thereto. For example, the shape may be any of other polygonal shapes such as a triangular shape or a pentagonal shape, a circular shape, a different shape, or the like.

The plurality of column portions 43 are erected on an upper surface side of the connection portion 42, and lower end portions of the plurality of column portions 43 are connected to each other by the connection portion 42.

The plurality of column portions 43 are disposed on the inner side of the atomic cell unit 2 when seen in a plan view. In this embodiment, four column portions 43 are provided so as to correspond to corner portions of the atomic cell 21 having a square shape. The cross-section of the column portion 43 has a quadrilateral shape. Meanwhile, the column portion 43 is not limited to the above-mentioned shape. For example, the column portion may have a tubular shape, or the cross-section of the column portion may have a circular shape.

The atomic cell unit 2 (more specifically, the substrate 28) is bonded (connected) to an upper end portion (end on a side opposite to the connection portion 42) of each of the column portions 43. Thereby, the atomic cell unit 2 is supported by the supporting member 4.

In the supporting member 4 configured in this manner, heat emitted from the atomic cell unit 2 passes through the column portion 43, the connection portion 42, and the leg portion 41 in this order and is transmitted to the base 31. Thereby, it is possible to lengthen a transmission path of heat transmitted from the atomic cell unit 2 to the base 31 through the supporting member 4.

In addition, a constituent material of the supporting member 4 is not particularly limited insofar as the constituent material is a material having a relatively low thermal conductivity and is capable of securing rigidity for the supporting member 4 to support the atomic cell unit 2. For example, it is preferable to use a nonmetal such as a resin material or a ceramic material, and it is more preferable to use a resin material. In a case where the supporting member 4 is mainly formed of a resin material, it is possible to increase thermal resistance of the supporting member 4 and to easily manufacture the supporting member 4 using a known method such as injection molding in spite of a complex shape of the supporting member 4. In particular, in a case where the supporting member 4 is mainly formed of a resin material, it is possible to easily form the supporting member 4 formed of a formed material having a large thermal resistance.

In addition, it is preferable that a nonmagnetic material is used as a constituent material of the supporting member 4 so as not to hinder a magnetic field from the coil 27.

According to the supporting member 4 described above, the supporting member is disposed between the atomic cell unit 2 and the base 31, and thus it is possible to reduce heat transfer between the atomic cell unit 2 and the outside and to control the temperature of the atomic cell 21, the light emitting unit 22, and the like with a high level of accuracy. In addition, when the getter material 62 of the getter member 6 to be described later is activated by heating, it is possible to reduce heat transfer between the atomic cell unit 2 and the getter material 62 and to reduce the adverse influence of the heat on the atomic cell unit 2.

Control Unit

The control unit 5 illustrated in FIG. 1 has a function of controlling the heater 25, the coil 27, and the light emitting unit 22.

The control unit 5 includes an excitation light control unit 51 that controls frequencies of the resonant light beams 1 and 2 of the light emitting unit 22, a temperature control unit 52 that controls the temperature of an alkali metal in the atomic cell 21, and a magnetic field control unit 53 that controls a magnetic field applied to the atomic cell 21.

The excitation light control unit 51 controls frequencies of the resonant light beams 1 and 2 emitted from the light emitting unit 22 on the basis of detection results of the light detection unit 24 mentioned above. More specifically, the excitation light control unit 51 controls frequencies of the resonant light beams 1 and 2 emitted from the light emitting unit 22 so that the frequency difference ($\omega_1$-$\omega_2$) is set to the above-mentioned frequency $\omega_0$ inherent in an alkali metal. In addition, the excitation light control unit 51 controls center frequencies of the resonant light beams 1 and 2 emitted from the light emitting unit 22.

Here, although not shown in the drawing, the excitation light control unit 51 includes a voltage controlled quartz crystal oscillator (oscillation circuit), and outputs an output signal of the voltage controlled quartz crystal oscillator as an output signal of the atomic oscillator 1 while synchronizing and adjusting an oscillation frequency of the voltage controlled quartz crystal oscillator on the basis of detection results of the light detection unit 24.

Although not shown in the drawing, for example, the excitation light control unit 51 includes a multiplier that frequency multiplies an output signal from the voltage controlled quartz crystal oscillator, and superimposes the signal (high frequency signal) multiplied by the multiplier on a direct bias current to input the superimposed signal to the light emitting unit 22 as a driving signal. Thereby, the voltage controlled quartz crystal oscillator is controlled so that an EIT signal is detected by the light detection unit 24, and thus a signal having a desired frequency is output from the voltage controlled quartz crystal oscillator. A multiplication rate of the multiplier is $\omega_0/(2\times f)$, for example, when a desired frequency of an output signal from the atomic oscillator 1 is set to f. Thereby, when an oscillation frequency of the voltage controlled quartz crystal oscillator is f, the light emitting unit 22 constituted by a light emitting element such as a semiconductor laser is modulated using a signal from the multiplier, thereby allowing two light beams having a frequency difference ($\omega_1$-$\omega_2$) therebetween being $\omega_0$ to be emitted.

In addition, the temperature control unit 52 controls electrical conduction to the heater 25 on the basis of detection results of the temperature sensor 26. Thereby, it is possible to keep the atomic cell 21 within a desired temperature range.

In addition, the magnetic field control unit 53 controls electrical conduction to the coil 27 so that a magnetic field generated by the coil 27 becomes constant.

The control unit 5 is provided in, for example, an IC chip mounted on a substrate having the package 3 mounted thereon. Meanwhile, the control unit 5 may be provided within the package 3 (for example, on the base 31).

Getter Member

The getter member 6 is disposed on the base 31 in the internal space S1 of the package 3. In this embodiment, as illustrated in FIG. 5, the getter member 6 is disposed at a position separated from the atomic cell unit 2 when seen in a plan view. The getter member 6 has a function of adsorbing and removing unnecessary gas in the internal space S1.

As illustrated in FIGS. 6A and 6B, the getter member 6 includes a heat generating portion 61, the getter material 62 provided on the heat generating portion 61, and a pair of conductive terminals 63 that support the heat generating portion 61 for each getter material 62.

The heat generating portion 61 is constituted by a strip-shaped heating resistor, and has a function of generating heat by electrical conduction. The heat generating portion 61 can heat the getter material 62 by the heat generation. A specific material for forming the heat generating portion 61 is not particularly limited, and examples of the material include indium tin oxide (ITO), a carbon-based material, barium-based ceramic titanate ($BaTiO_3$), Fe—Cr—Al (Fe—Cr—Al alloy), Ni—Cr (Ni—Cr alloy), and the like.

In addition, it is preferable that a distance between the base 31 and the heat generating portion 61 is larger than a distance between the base 31 and the atomic cell 21. Thereby, it is possible to reduce heat transfer from the heat generating portion 61 to the atomic cell unit 2.

The getter material 62 is provided on one surface (upper surface) of the heat generating portion 61 in the form of a layer. The getter material 62 has a function of adsorbing or absorbing (adsorption function) unnecessary gas (for example, nitrogen gas, oxygen gas, or the like) in the internal space S1. In this embodiment, the getter material 62 has the same width and length as those of the heat generating portion 61, and is formed throughout the entirety of one surface (surface on a side opposite to the conductive terminal 63) of the heat generating portion 61. Thereby, it is possible to increase the surface area of the getter material 62 as much as possible and to increase an adsorption function of the getter material 62.

The getter material 62 is not particularly limited insofar as the getter material has such a function, and examples of the getter material include an alloy containing at least one of titanium, barium, tantalum, zirconium, aluminum, vanadium, indium, and calcium, and an Al—Zr—V—Fe-based alloy.

On the other hand, the other surface (lower surface) of the heat generating portion 61 is supported by the base 31 of the package 3 through a pair of conductive terminals 63. Thereby, the heat generating portion 61 is supported by a pair of conductive terminals 63 in a state of being separated from the base 31. Here, the pair of conductive terminals 63 are connected to both ends of the heat generating portion 61, respectively, and fix and support both ends of the heat generating portion 61 with respect to the base 31 of the package 3. Thereby, a gap is formed between the base 31 and each of the heat generating portion 61 and the getter material 62. In this manner, each of the heat generating portion 61 and the getter material 62 are disposed on the base 31 with a gap (for example, equal to or greater than approximately 0.1 mm and equal to or less than approximately 3 mm) between the base 31 and each of the heat generating portion and the getter material in the internal space S1.

A constituent material of each of the conductive terminals 63 is not particularly limited insofar as the material has conductivity. Examples of the material include transparent electrode materials such as indium tin oxide (ITO) and zinc oxide (ZnO), metal materials such as gold (Au), a gold alloy, platinum (Pt), aluminum (Al), an aluminum alloy, silver (Ag), a silver alloy, chromium (Cr), a chrome alloy, copper (Cu), molybdenum (Mo), niobium (Nb), tungsten (W), iron (Fe), titanium (Ti), cobalt (Co), zinc (Zn), and zirconium (Zr), and a semiconductor material such as silicon (Si), but it is preferable to use a metal material (particularly, copper). Copper has excellent conductivity and is a relatively soft metal among metals. For this reason, it is possible to efficiently supply power to the heat generating portion 61 through the conductive terminal 63 by constituting the conductive terminal 63 using copper and to relax stress between the heat generating portion 61 and the base 31 by the conductive terminal 63 even when the heat generating portion 61 thermally expands in association with heat generation.

According to the getter member 6 mentioned above, it is possible to reduce unnecessary gas by adsorbing and removing the unnecessary gas in the internal space S1 accommodating the atomic cell unit 2, by the getter material 62. In particular, since the getter material 62 is disposed so as to have a gap with respect to the base 31, it is possible to reduce the adverse influence (for example, damages of sealing portions of the base 31 and the lid 32, and the atomic cell unit 2) of heat on other portions when the getter material 62 is activated by heating. For this reason, it is possible to maintain a high degree of vacuum of the internal space S1 over a long period of time and to make the atomic oscillator 1 have excellent characteristics.

In this embodiment, since functional components accommodated in the package include the atomic cell unit 2, it is possible to control the temperature of the atomic cell 21, the light emitting unit 22, and the like with a high level of accuracy and to make the atomic oscillator 1 (quantum interference device) have excellent characteristics.

In particular, it is possible to heat the getter material 62 using the heat generating portion 61. In addition, since the heat generating portion 61 is disposed so as to have a gap with respect to the base 31, it is possible to reduce adverse influence (for example, damages of sealing portions of the base 31 and the lid 32, and the atomic cell unit 2) of heat of the heat generating portion 61 on other portions.

In addition, since the getter material 62 and the heat generating portion 61 are layered and are laminated on each other, it is possible to realize the getter member 6 (the getter material 62 and the heat generating portion 61) which is small in size and is capable of being easily formed on the base 31.

In addition, since the pair of conductive terminals 63 connect the heat generating portion 61 and the base 31 to each other, it is possible to make the heat generating portion 61 generate heat by supplying power to the heat generating portion 61 through the pair of conductive terminals 63. For this reason, it is possible to easily activate the getter material 62 after sealing the package 3.

According to the atomic oscillator 1 mentioned above, it is possible to maintain a high degree of vacuum of the internal space S1 over a long period of time and to make the atomic oscillator have excellent characteristics.

Method of Manufacturing Electronic Device

Hereinafter, a method of manufacturing an electronic device according to the invention will be described by taking an example of a case where the atomic oscillator 1 mentioned above is manufactured.

Figure 7A:
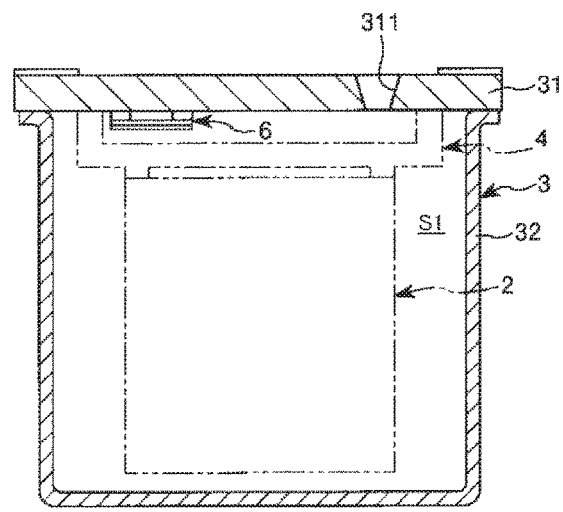
FIGS. 7A and 7B are diagrams illustrating a method of using the getter material illustrated in FIG. 4 (method of manufacturing an electronic device).
Figure 7B:
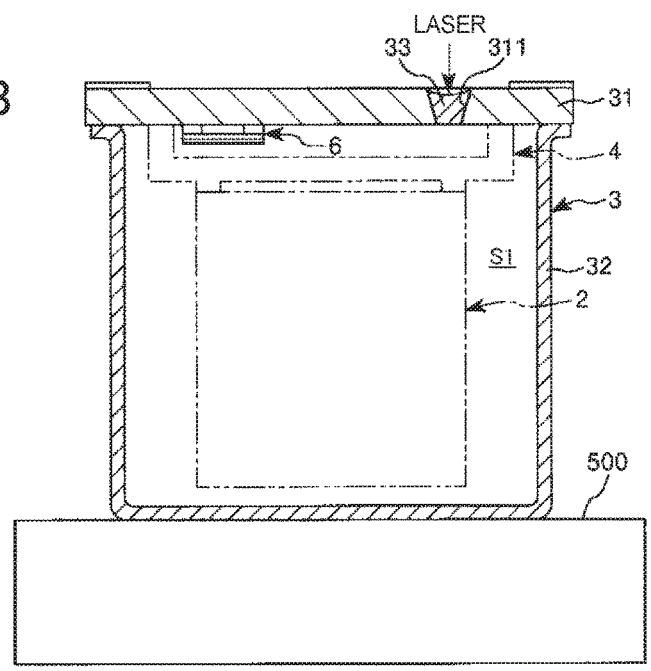
Figure 8:
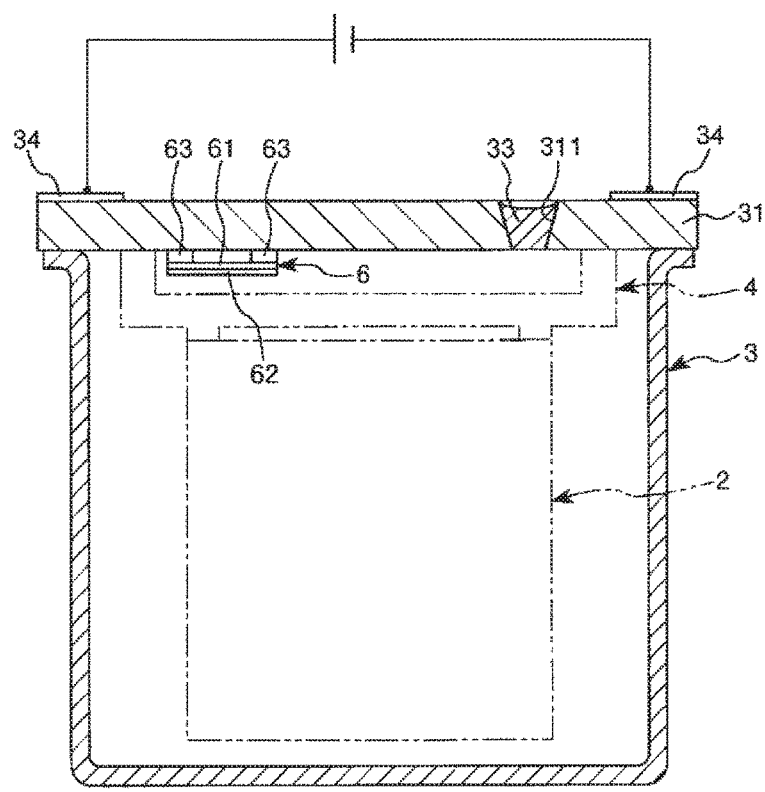
FIG. 8 is a diagram illustrating a method of using the getter material illustrated in FIG. 4 (method of manufacturing an electronic device).

FIGS. 7A and 7B and FIG. 8 are diagrams illustrating a method of using the getter material illustrated in FIG. 4 (method of manufacturing an electronic device).

A method of manufacturing the atomic oscillator 1 includes [1] a process of forming the internal space S1, [2] a process of closing the hole 311 by the sealing material 33, and [3] a process of activating the getter material 62. Hereinafter, the processes will be sequentially described.

[1] Process of Forming Internal Space S1

First, as illustrated in FIG. 7A, the atomic cell unit 2 and the getter member 6 are disposed on the base 31, and the base 31 and the lid 32 are bonded to each other, thereby forming the internal space S1 accommodating the atomic cell unit 2 and the getter member 6 by the base 31 and the lid 32. Here, the hole 311 is formed in the base 31 so as to pass therethrough.

The getter member 6 can be formed using, for example, the same method as that in a known wiring formation process.

[2] Process of Closing Hole 311 by Sealing Material 33

Next, as illustrated in FIG. 7B, the internal space S1 is sealed by closing the hole 311 by the sealing material 33.

In more detail, the sealing material 33 is formed by mounting solder balls formed of a metal such as AuGe in the hole 311 and welding the solder balls by a laser. At this time, the internal space S1 which is vacuum-sealed is obtained by forming the sealing material 33 under vacuum (under reduced pressure).

In addition, for example, as illustrated in FIG. 7B, the sealing material 33 is formed while heating the base 31 and the lid 32 by a hotplate 500. Thereby, an inner wall surface of the hole 311 is heated, and the adhesiveness of the sealing material 33 with respect to the inner wall surface of the hole 311 is improved, thereby making the sealing material having an excellent sealing characteristic. Meanwhile, metallization for improving the adhesiveness of the sealing material 33, or the like may be performed on the inner wall surface of the hole 311.

[3] Process of Activating Getter Material 62

Next, as illustrated in FIG. 8, electrical conduction is performed on the heat generating portion 61 of the getter member 6 through the terminals 34 provided on the outer surface of the base 31 and the conductive terminals of the getter member 6. Thereby, the getter material 62 is heated and activated by making the heat generating portion 61 generate heat. At this time, the heat generating portion 61 and the getter material 62 are disposed so as to have a gap with respect to the base 31. Thereby, it is possible to reduce the adverse influence (for example, damages of a sealing portion and a functional component) of heat from the heat generating portion 61 and the getter material 62 on other portions.

According to the above-described method of manufacturing the atomic oscillator 1, it is possible to reduce unnecessary gas in the internal space S1 accommodating the atomic cell unit 2 by adsorbing and removing the gas by the getter material 62. In particular, since the heat generating portion 61 and the getter material 62 are disposed so as to have a gap with respect to the base 31, it is possible to reduce the adverse influence (for example, damages of a sealing portion and a functional component) of heat on other portions when the getter material 62 is activated by heating. For this reason, in the atomic oscillator 1 obtained, it is possible to maintain a high degree of vacuum of the internal space S1 over a long period of time and to make the atomic oscillator have excellent characteristics.

Second Embodiment

Next, a second embodiment of the invention will be described.

Figure 9A:
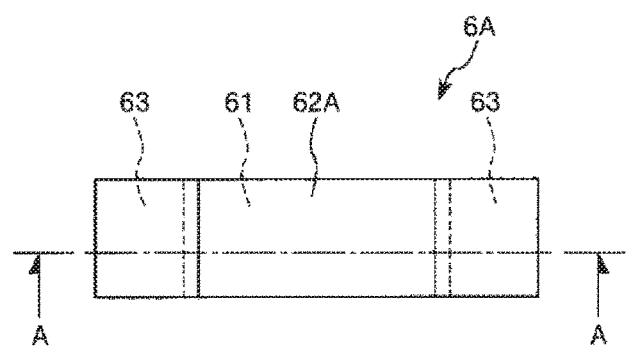
FIGS. 9A and 9B are diagrams illustrating a getter material, a heat generating portion, and a conductive terminal according to a second embodiment of the invention.
Figure 9B:
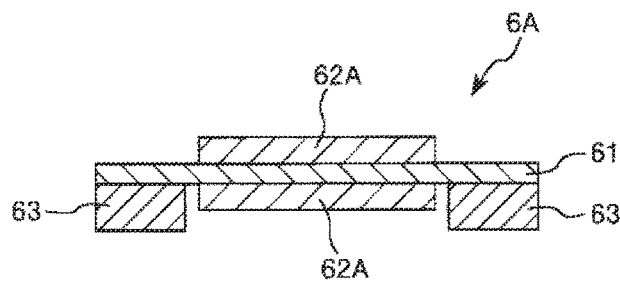

FIGS. 9A and 9B are diagrams illustrating a getter material, a heat generating portion, and a conductive terminal according to the second embodiment of the invention, FIG. 9A is a plan view, and FIG. 9B is a cross-sectional view taken along line A-A in FIG. 9A.

This embodiment is the same as the above-described first embodiment except that the arrangement of a getter material of a getter member.

Meanwhile, in the following description, the second embodiment will be described focusing on differences from the above-described embodiment, and a description of the same matters will be omitted. In addition, in FIGS. 9A and 9B, the same components as those in the above-described embodiment will be denoted by the same reference numerals and signs.

As illustrated in FIGS. 9A and 9B, a getter member 6A according to this embodiment includes a heat generating portion 61, a pair of getter materials 62A provided on the heat generating portion 61, a pair of getter materials 62A provided on the heat generating portion 61, and a pair of conductive terminals 63 that support the heat generating portion 61 for each getter material 62A. Here, the getter materials 62A have a two-layered structure, and the heat generating portion 61 is present between the two getter materials 62A. Thereby, it is possible to increase the surface area of the getter material 62A and to make the getter member 6A have an excellent adsorption function while reducing an installation space of the getter member 6A which is a laminated body including the getter material 62A and the heat generating portion 61.

In addition, in this embodiment, the length of the getter material 62A is shorter than the length of the heat generating portion 61, and the getter material 62A is disposed between the pair of conductive terminals 63 when seen in a plan view. Thereby, it is possible to dispose the getter material 62A so as to be biased to a side of a portion of the heat generating portion 61 of which the temperature becomes the highest and to efficiently heat the getter material 62A by the heat generating portion 61.

Third Embodiment (Crystal Oscillator)

Next, a third embodiment of the invention will be described.

Figure 10:
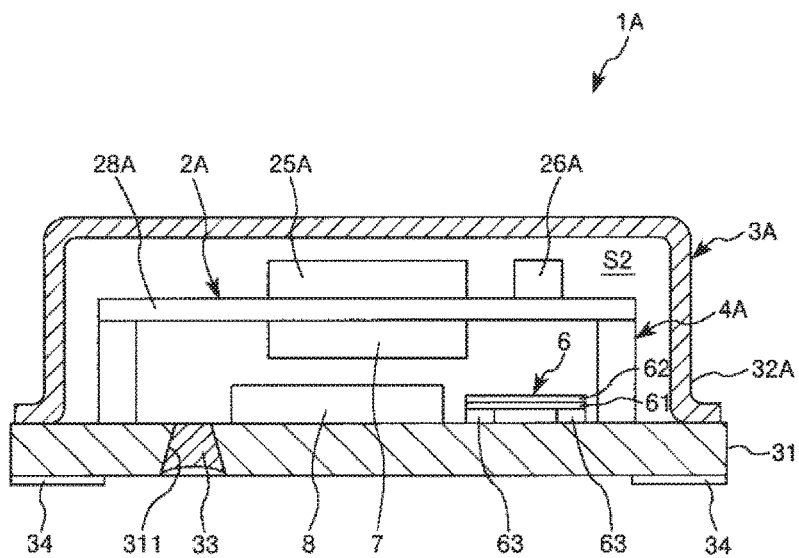
FIG. 10 is a cross-sectional view illustrating a schematic configuration of an electronic device (crystal oscillator) according to a third embodiment of the invention.

FIG. 10 is a cross-sectional view illustrating a schematic configuration of an electronic device (crystal oscillator) according to the third embodiment of the invention.

This embodiment is the same as the above-described first embodiment except that the electronic device according to the invention is applied to a quartz crystal oscillator.

Meanwhile, in the following description, the third embodiment will be described focusing on differences from the above-described embodiment, and a description of the same matters will be omitted. In addition, in FIG. 10, the same components as those in the above-described embodiment will be denoted by the same reference numerals and signs.

As illustrated in FIG. 10, a quartz crystal oscillator 1A (electronic device) includes a unit 2A (functional component) in which a quartz crystal vibrator 7, a heater 25A, and a temperature sensor 26A are mounted on a substrate 28A, a package 3A that accommodates the unit 2A, a supporting member 4A (supporting portion) which is accommodated in the package 3A and supports the unit 2A with respect to the package 3A, and a getter member 6 which is accommodated in the package 3A.

The package 3A includes a base 31 (base portion) and a bottomed cylindrical lid 32A (lid portion), and an opening of the lid 32A is blocked by the base 31. Thereby, an internal space S2 accommodating the unit 2A, the supporting member 4A, and the getter member 6 is formed. In addition, an IC chip 8 (functional component) is provided on the base 31 in the internal space S2. The IC chip 8 includes a driving circuit for constituting an oscillation circuit together with the quartz crystal vibrator 7, a temperature control circuit for controlling temperature using the heater 25A and the temperature sensor 26A, and the like.

In the unit 2A, the substrate 28A is, for example, a wiring substrate, and the heater 25A and the temperature sensor 26A are mounted on an upper surface of the substrate 28A. On the other hand, the quartz crystal vibrator 7 is mounted on a lower surface of the substrate 28A. In the unit 2A, the heater 25A is driven on the basis of a detected temperature of the temperature sensor 26A, and the quartz crystal vibrator 7 is kept at a predetermined temperature.

The quartz crystal vibrator 7 is not particularly limited. For example, an SC cut or AT cut quartz crystal vibrator, a surface acoustic wave (SAW) resonator, or the like can be used.

The substrate 28A of the unit 2A is supported by the base 31 of the package 3A through the supporting member 4A.

According to the quartz crystal oscillator 1A described above, the getter material 62 is disposed so as to have a gap with respect to the base 31 in the internal space S2, and thus it is possible to maintain a high degree of vacuum of the internal space S2 over a long period of time and to make the atomic oscillator have excellent characteristics.

Fourth Embodiment (Magnetocardiograph)

Next, a fourth embodiment of the invention will be described.

Figure 11A:
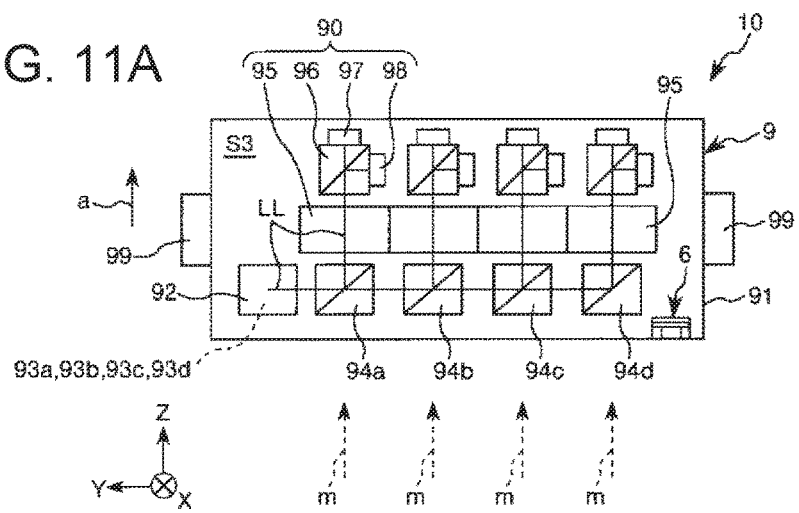
FIGS. 11A and 11B are cross-sectional views illustrating a schematic configuration of an electronic device (magnetocardiograph) according to a fourth embodiment of the invention.
Figure 11B:
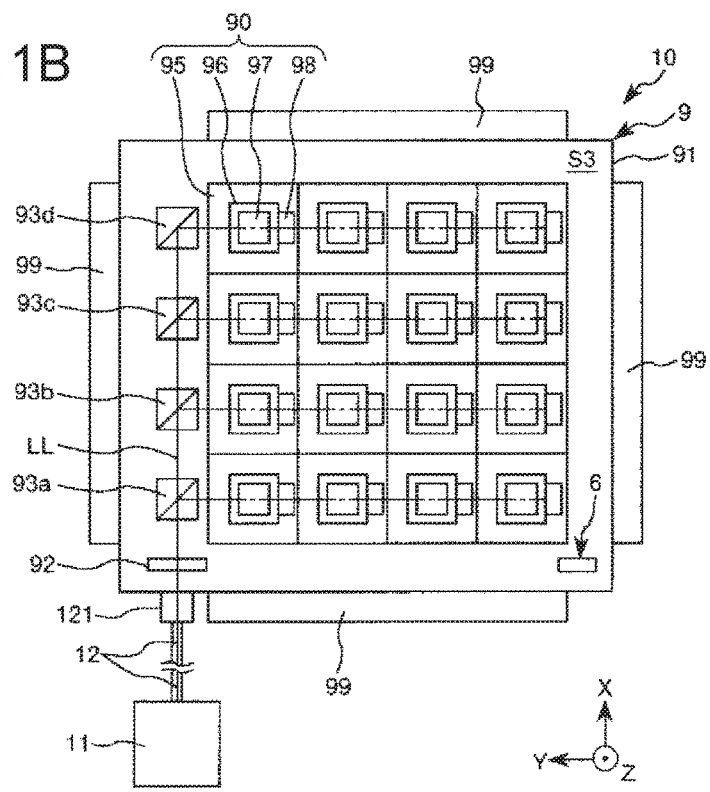

FIGS. 11A and 11B are cross-sectional views illustrating a schematic configuration of an electronic device (magnetocardiograph) according to the fourth embodiment of the invention.

This embodiment is the same as the above-described first embodiment except that the electronic device according to the invention is applied to a magnetocardiograph.

Meanwhile, in the following description, the fourth embodiment will be described focusing on differences from the above-described embodiment, and a description of the same matters will be omitted. In addition, in FIGS. 11A and 11B, the same components as those in the above-described embodiment will be denoted by the same reference numerals and signs.

A magnetocardiograph 10 illustrated in FIGS. 11A and 11B includes a magnetic sensor 9, and a laser light source 11 connected to the magnetic sensor 9 through an optical fiber 12.

The laser light source 11 outputs excitation light LL having a wavelength depending on, for example, an absorption line of cesium. The wavelength of the excitation light LL is, for example, 894 nm equivalent to a line D1. In addition, the laser light source 11 is a tunable laser, and the excitation light LL which is output from the laser light source 11 is a continuous beam having a fixed amount of light.

The laser light source 11 is connected to the magnetic sensor 9 through the optical fiber 12. The excitation light LL from the laser light source 11 is supplied to the magnetic sensor 9 through the optical fiber 12. An optical connector 121 connected to the magnetic sensor 9 is provided at an end of the optical fiber 12 on the magnetic sensor 9 side.

The magnetic sensor 9 is a sensor which is called an optical pumping magnetometer or an optical pumping atomic magnetic sensor. The magnetic sensor 9 includes a package 91, a polarizing plate 92 disposed within the package 91, mirrors 93a to 93d and 94a to 94d, a plurality of sensor elements 90, a getter member 6, and a plurality of heaters 99 provided on an outer surface of the package 91.

Excitation light LL, traveling in a +X-axis direction, which is supplied to the magnetic sensor 9 through the optical connector 121 passes through the polarizing plate 92. The excitation light LL having passed through the polarizing plate 92 is linearly polarized light, and passes through the mirrors 93a, 93b, and 93c which are half mirrors in this order along the +X-axis direction, and is incident on the mirror 93d which is a reflecting mirror. At this time, each of the mirrors 93a, 93b, and 93c reflects a portion of the excitation light LL toward a −Y-axis direction. In addition, the mirror 93d reflects the entirety of the incident excitation light LL toward the −Y-axis direction.

In this manner, the excitation light LL is branched into four light paths by the mirrors 93a, 93b, 93c, and 93d. Here, reflexibilities of the mirrors 93a, 93b, 93c, and 93d are set so that light intensities of the excitation light LL branched into four light paths are set to be the same as each other.

The excitation light LL reflected by the mirrors 93a, 93b, 93c, and 93d passes through the mirrors 94a, 94b, and 94c which are half mirrors in this order along the −Y-axis direction, and is incident on the mirror 94d which is a reflecting mirror. At this time, each of the mirrors 94a, 94b, and 94c reflects a portion of the excitation light LL toward a +Z-axis direction. In addition, the mirror 94d reflects the entirety of the incident excitation light LL toward the +Z-axis direction.

In this manner, the excitation light LL having one light path is branched into four light paths by the mirrors 94a, 94b, 94c, and 94d. As a result, the excitation light LL is branched into a total of sixteen light paths. Here, reflexibilities of the mirrors 94a, 94b, 94c, and 94d are set so that light intensities of the excitation light LL branched into four light paths are set to be the same as each other.

In this manner, the excitation light LL branched into sixteen light paths by the mirrors 93a, 93b, 93c, 93d, 94a, 94b, 94c, and 94d is incident on the individual sensor elements 90. Therefore, sixteen sensor elements 90 are provided so as to correspond to the branched sixteen excitation lights LL.

Each of the sensor elements 90 includes an atomic cell 95, a polarized light separator 96, and photodetectors 97 and 98.

Sixteen atomic cells 95 are arranged in a matrix of four rows by four columns, and are respectively disposed on light paths of the excitation light LL on the +Z-axis direction side of the mirrors 94a, 94b, 94c, and 94d mentioned above. Therefore, the excitation light LL reflected by each of the mirrors 94a, 94b, 94c, and 94d incident on the atomic cell 95. Each of the atomic cells 95 is configured in the same manner as the atomic cell 21 in the above-described first embodiment.

The polarized light separator 96 is installed on the +Z-axis direction side of each of the atomic cells 95, and excitation light LL having passed through the atomic cell 95 is incident on the polarized light separator 96. The polarized light separator 96 is an element that divides the incident excitation light LL into two polarized light components perpendicular to each other. For example, a Wollaston prism or a polarized beam splitter can be used as the polarized light separator 96.

A photodetector 97 is installed on the +Z-axis direction side of the polarized light separator 96, and a photodetector 98 is installed on the −Y-axis direction side of the polarized light separator 96. Excitation light LL (one polarized light component) which has passed through the polarized light separator 96 is incident on the photodetector 97, and excitation light LL (the other polarized light component) which is reflected by the polarized light separator 96 is incident on the photodetector 98. Each of the photodetectors 97 and 98 outputs a current based on the amount of incident excitation light LL. It is preferable that each of the photodetectors 97 and 98 is formed of a nonmagnetic material. Thereby, it is possible to prevent influence from exerting on measurement due to a magnetic field generated from the photodetectors 97 and 98.

The package 91 accommodates the polarizing plate 92, the mirrors 93a to 93d and 94a to 94d, the plurality of sensor elements 90, and the getter member 6. Although not shown in the drawing, the package 91 includes a base portion on which the polarizing plate 92, the mirrors 93a to 93d and 94a to 94d, the plurality of sensor elements 90, and the getter member 6 are disposed, and a lid portion that constitutes (partitions and forms) the internal space S3, accommodating components on the base portion, together with the base portion.

In addition, the heaters 99 are installed on both surfaces in the X-axis direction and both surfaces in the Y-axis direction of the outer surface of the package 91. It is preferable that the heater 99 has a structure that does not generate a magnetic field, and it is preferable to use, for example, a type of heater that performs heating by making vapor or a hot wind pass through a flow channel. Meanwhile, a method of heating the atomic cell 95 is not limited to a method using the heater 99. For example, a method of dielectrically heating the atomic cell 95 by a high frequency voltage may be used.

The magnetocardiograph 10 configured as described above is used, for example, as follows.

In using the magnetocardiograph 10, the magnetic sensor 9 is disposed so that a test object is located on the −Z-axis direction side with respect to the magnetic sensor. Thereby, a magnetic vector m emitted by the test object passes through the atomic cell 95 of the magnetic sensor 9 from the −Z-axis direction side to the +Z-axis direction side.

Here, cesium gas (cesium atoms) within the atomic cell 95 is excited by being irradiated with excitation light LL which is linearly polarized light, and the orientation of magnetic moment is aligned. In this state, when the magnetic vector m passes through the atomic cell 95, the magnetic moment of cesium atoms processes by a magnetic field of the magnetic vector m. The precession is called Larmor precession. The magnitude of the Larmor precession has a positive correlation with the intensity of the magnetic vector m. In addition, the Larmor precession rotates a deflection surface of the excitation light LL. The magnitude of the Larmor precession and a variation in a rotation angle of the deflection surface of the excitation light LL have a positive correlation. Therefore, the intensity of the magnetic vector m and a variation in a rotation angle of the deflection surface of the excitation light LL have a positive correlation. The magnetic sensor 9 is configured such that the sensitivity of the magnetic vector m in a first direction a along the Z-axis direction is high and the sensitivity of a component perpendicular to the first direction a is low.

The photodetectors 97 and 98 detect the intensity of linearly polarized light of two components perpendicular to each other to thereby detect a rotation angle of a deflection surface of excitation light LL. The magnetic sensor 9 detects the intensity of the magnetic vector m from changes in the rotation angle of the deflection surface of the excitation light LL.

According to the above-mentioned magnetocardiograph 10, it is possible to maintain a high degree of vacuum of an internal space over a long period of time and to make the atomic oscillator have excellent characteristics.

Meanwhile, the number and arrangement of the sensor elements 90 are not limited to those described above. For example, the number of rows of the sensor elements arranged may be equal to or less than three or may be equal to or greater than five. It is possible to increase a spatial resolution as the number of sensor elements 90 increases.

2. Electronic Apparatus

The above-described oscillator according to the invention can be incorporated into various types of electronic apparatuses. The electronic apparatus including the oscillator according to the invention has excellent reliability.

Hereinafter, an example of an electronic apparatus including the oscillator according to the invention will be described.

Figure 12:
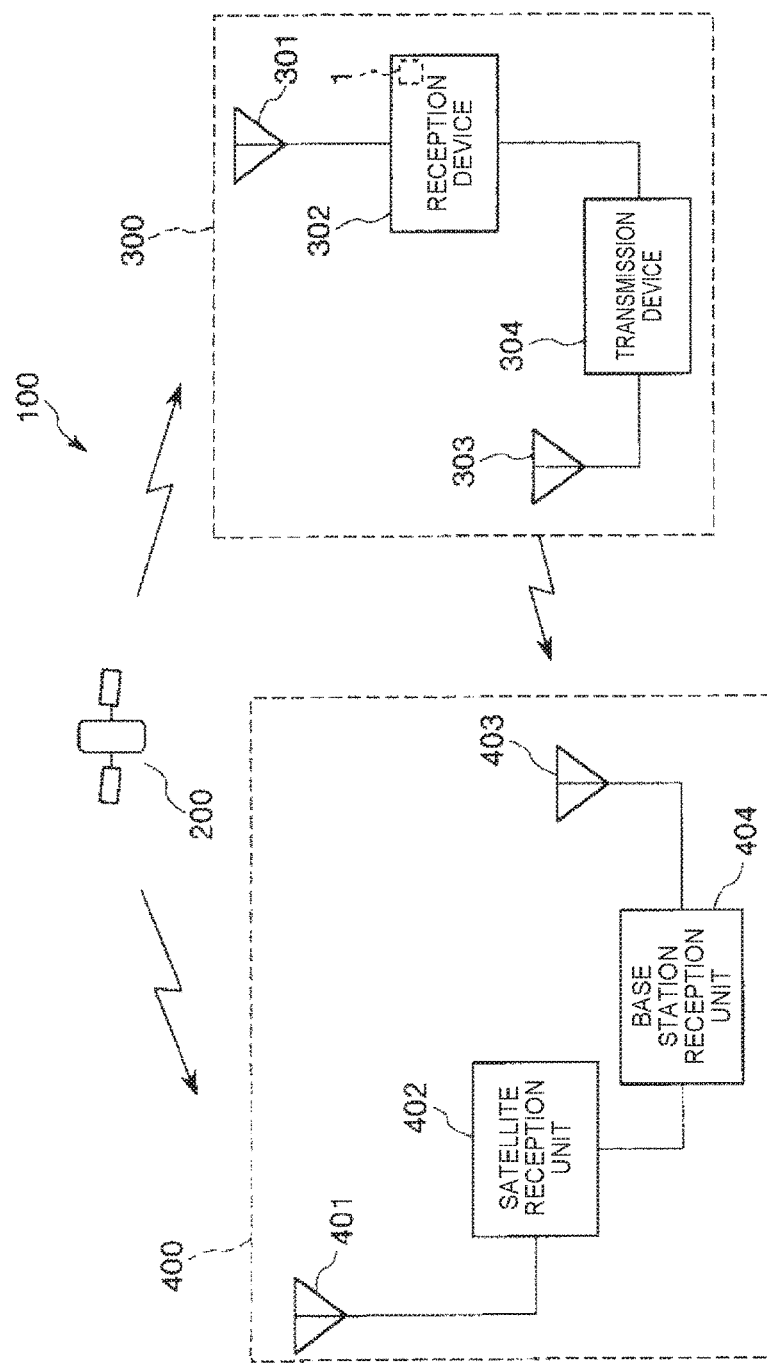
FIG. 12 is a diagram illustrating a schematic configuration in a case where the oscillator according to the invention is applied to a positioning system using a GPS satellite.

FIG. 12 is a diagram illustrating a schematic configuration in a case where the oscillator according to the invention is applied to a positioning system using a GPS satellite.

A positioning system 100 illustrated in FIG. 12 includes a GPS satellite 200, a base station device 300, and a GPS reception device 400.

The GPS satellite 200 transmits positioning information (GPS signal).

The base station device 300 includes a reception device 302 that receives positioning information from the GPS satellite 200 with a high level of accuracy through an antenna 301 installed, for example, at an electronic reference point (GPS continuous observation station), and a transmission device 304 that transmits the positioning information, which is received by the reception device 302, through an antenna 303.

Here, the reception device 302 is an electronic device including the atomic oscillator 1 mentioned above according to the invention as the reference frequency oscillation source thereof. The reception device 302 has excellent reliability. In addition, the positioning information received by the reception device 302 is transmitted by the transmission device 304 in real time.

The GPS reception device 400 includes a satellite reception unit 402 that receives positioning information from the GPS satellite 200 through an antenna 401, and a base station reception unit 404 that receives positioning information from the base station device 300 through an antenna 403.

3. Moving Object

In addition, the above-described oscillator according to the invention can be incorporated into various types of moving objects. The moving object including the oscillator according to the invention has excellent reliability.

Hereinafter, an example of the moving object according to the invention will be described.

Figure 13:
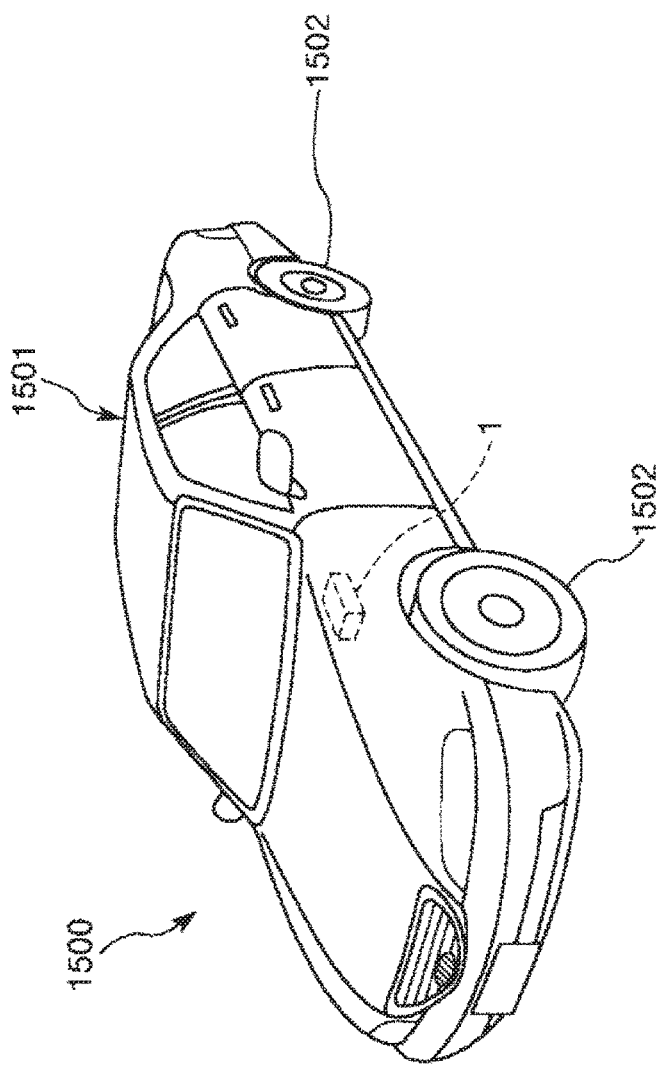
FIG. 13 is a perspective view illustrating a configuration of a moving object (vehicle) including the oscillator according to the invention.

FIG. 13 is a perspective view illustrating a configuration of a moving object (vehicle) including the oscillator according to the invention.

In this diagram, a moving object 1500 includes a car body 1501 and four wheels 1502, and is configured to rotate the wheels 1502 using a power source (engine), not shown in the drawing, which is provided in the car body 1501. The atomic oscillator 1 is incorporated in the moving object 1500. For example, a control unit not shown in the drawing controls the driving of the power source on the basis of an oscillation signal from the atomic oscillator 1.

Meanwhile, the electronic apparatus according to the invention is not limited to that described above, and can be applied to, for example, a smartphone, a tablet terminal, a clock, a mobile phone, a digital still camera, an ink jet type discharge apparatus (for example, an ink jet printer), a personal computer (a mobile personal computer and a laptop type personal computer), a television, a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, and ships), a flight simulator, terrestrial digital broadcasting, a mobile phone base station, and the like.

The electronic device, the quantum interference device, the atomic oscillator, the magnetocardiograph, the oscillator, the electronic apparatus, the moving object, and the method of manufacturing an electronic device according to the invention have been described so far with reference to the embodiments shown in the drawings, but the invention is not limited thereto. For example, a configuration of each unit in the above-described embodiments can be replaced with any configuration exhibiting the same function, and can be added with any configuration.

In addition, a configuration within the package in each of the above-described embodiments is just an example, and is not limited thereto. Configurations of components within the package may be appropriately changed.

In addition, in the above-described embodiments, a description has been given of an example of a case where the electronic device according to the invention is applied to an atomic oscillator, a quartz crystal oscillator, and a magnetocardiograph (magnetic sensor) which use a quantum interference effect. However, the electronic device is not limited thereto insofar as the electronic device accommodates functional components in a package which is airtightly sealed. For example, the invention can also be applied to oscillators other than an atomic oscillator and a quartz crystal oscillator which use a double resonance method.

What is claimed is:

1. An electronic device comprising:
    a base;
    a functional component that is disposed on the base, the functional component including one of an atomic cell and a vibrator;
    a lid that is provided over the functional component, the base and the lid constituting an internal space accommodating the functional component;

a getter material that is disposed in the internal space above the base and that is spaced apart from the base; and a heater that is disposed in the internal space above the base and that is spaced apart from the base, the heater being configured to heat the getter material.

2. The electronic device according to claim 1, wherein the getter material and the heater are stacked on each other.

3. The electronic device according to claim 2, wherein the getter material is configured with two layers, and the heater is present between the two layers of the getter material.

4. The electronic device according to claim 1, further comprising:
a conductive terminal that is disposed in the internal space and that connects the heater and the base to each other.

5. The electronic device according to claim 4, wherein the conductive terminal includes copper.

6. The electronic device according to claim 1, wherein one of the base and the lid includes a hole passing from an inside to an outside of the internal space, and wherein the hole is closed by a sealing material.

7. The electronic device according to claim 1, further comprising:
a temperature adjustor that is configured to adjust a temperature of the functional component.

8. A quantum interference device comprising the electronic device according to claim 1; and
an external terminal that is disposed on an external surface of the base.

9. A quantum interference device comprising the electronic device according to claim 2; and
an external terminal that is disposed on an external surface of the base.

10. The quantum interference device according to claim 8, wherein the functional component includes the atomic cell that accommodates metal atoms, a light source that emits resonating light to the metal atoms, and a light detector detecting passed light that has passed through the atomic cell.

11. The quantum interference device according to claim 8, further comprising:

a support member that is disposed in the internal space between the functional component and the base so as to fix the functional component to the base.

12. The quantum interference device according to claim 8, wherein a distance between the base and the heater is smaller than a distance between the base and the functional component.

13. An atomic oscillator comprising:
the quantum interference device according to claim 8; and
an excitation light controller that is configured to control a frequency of a light emitted from a light source toward the functional component.

14. An atomic oscillator comprising:
the quantum interference device according to claim 10; and
an excitation light controller that is configured to control a frequency of a light emitted from a light source toward the functional component.

15. An oscillator comprising:
the electronic device according to claim 1,
wherein the functional component includes the vibrator and an IC chip having a driving circuit.

16. A moving object comprising:
the electronic device according to claim 1; and
a movable body that houses the electronic device.

17. A method of manufacturing an electronic device, the method comprising:
providing a base, a lid, a functional component, a getter material, and a heater, the functional component including one of an atomic cell and a vibrator;
providing a hole in one of the base and the lid;
forming an internal space by fixing the base to the lid so as to accommodate the functional component, the getter material, and the heater in the internal space, the functional component being disposed on the base;
sealing the internal space by closing the hole with a sealing material; and
activating the getter material by heat generated by the heater,
wherein the getter material is disposed in the internal space above the base and is spaced apart from the base, and
the heater is disposed in the internal space above the base and is spaced apart from the base.

* * * * *